United States Patent
Ishigaki et al.

(10) Patent No.: US 9,257,483 B2
(45) Date of Patent: Feb. 9, 2016

(54) MAGNETIC MEMORY, METHOD OF MANUFACTURING THE SAME, AND METHOD OF DRIVING THE SAME

(75) Inventors: Takashi Ishigaki, Hino (JP); Takayuki Kawahara, Higashiyamato (JP); Riichiro Takemura, Tokyo (JP); Kazuo Ono, Hachioji (JP); Kenchi Ito, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 384 days.

(21) Appl. No.: 13/522,076

(22) PCT Filed: Jan. 13, 2011

(86) PCT No.: PCT/JP2011/050404
§ 371 (c)(1),
(2), (4) Date: Oct. 31, 2012

(87) PCT Pub. No.: WO2011/087038
PCT Pub. Date: Jul. 21, 2011

(65) Prior Publication Data
US 2013/0044537 A1 Feb. 21, 2013

(30) Foreign Application Priority Data
Jan. 13, 2010 (JP) .................................. 2010-004523

(51) Int. Cl.
*G11C 11/00* (2006.01)
*H01L 27/22* (2006.01)
(Continued)

(52) U.S. Cl.
CPC .............. *H01L 27/228* (2013.01); *G11C 11/16* (2013.01); *G11C 11/5607* (2013.01); *H01L 29/82* (2013.01); *H01L 43/08* (2013.01); *H01L 43/12* (2013.01)

(58) Field of Classification Search
CPC ....... G11C 11/16; G11C 11/15; G11C 11/5607
USPC .................................................. 365/148, 158
See application file for complete search history.

(56) References Cited

U.S. PATENT DOCUMENTS 7,285,836 B2 * 10/2007 Ju et al. ......................... 257/421
2004/0085807 A1 5/2004 Hiramoto et al.
(Continued)

FOREIGN PATENT DOCUMENTS

JP 2003-78114 A 3/2003
JP 2004-128229 A 4/2004
(Continued)

OTHER PUBLICATIONS

Office Action dated Sep. 24, 2013, in Japanese Patent Application No. 2011-549996.
(Continued)

*Primary Examiner* — Anthan Tran
(74) *Attorney, Agent, or Firm* — Miles & Stockbridge P.C.

(57) ABSTRACT

There is provided a magnetic memory with using a magnetoresistive effect element of a spin-injection magnetization reversal type, in which a multi-value operation is possible and whose manufacturing and operation are simple. A preferred aim of this is solved by providing two or more magnetoresistive effect elements which are electrically connected in series to each other and by selecting one of the series-connected elements depending on a direction of a current carried in the series-connected elements, a magnitude thereof, and an order of the current thereof for performing the writing operation. For example, it is solved by differentiating plane area sizes of the respective magnetoresistive effect elements which have the same film structure from each other so as to differentiate resistance change amounts caused by respective magnetization reversal and threshold current values required for respective magnetization reversal from each other.

12 Claims, 16 Drawing Sheets

(51) Int. Cl.
*G11C 11/16* (2006.01)
*H01L 43/08* (2006.01)
*H01L 43/12* (2006.01)
*H01L 29/82* (2006.01)
*G11C 11/56* (2006.01)

(56) References Cited

U.S. PATENT DOCUMENTS

| | | |
|---|---|---|
| 2004/0136231 A1 | 7/2004 | Huai et al. |
| 2005/0237788 A1 | 10/2005 | Kano et al. |
| 2006/0261425 A1 | 11/2006 | Suemitsu et al. |
| 2008/0094882 A1* | 4/2008 | Asano et al. ............ 365/158 |
| 2009/0257274 A1* | 10/2009 | Itagaki et al. ........... 365/158 |

FOREIGN PATENT DOCUMENTS

| | | |
|---|---|---|
| JP | 2005-310829 A | 11/2005 |
| JP | 2006-203064 A | 8/2006 |
| JP | 2007-281334 A | 10/2007 |
| JP | 2008-243933 A | 10/2008 |
| JP | 2009-094226 A | 4/2009 |

OTHER PUBLICATIONS

Xiaohua Lou et al., "Demonstration of multilevel cell spin transfer switching in MgO magnetic tunnel junctions", Applied Physics Letters 93, 242502 (2008), pp. 1-3.

* cited by examiner

FIG. 4

| INFORMATION | RESISTANCE VALUE | WRITING OPERATION |
|---|---|---|
| 1 1 | $Rap_1 + Rap_2$ | $I^+_2$ |
| 1 0 | $Rap_1 + Rp_2$ | $I^-_2 \rightarrow I^+_1$ |
| 0 1 | $Rp_1 + Rap_2$ | $I^+_2 \rightarrow I^-_1$ |
| 0 0 | $Rp_1 + Rp_2$ | $I^-_2$ |

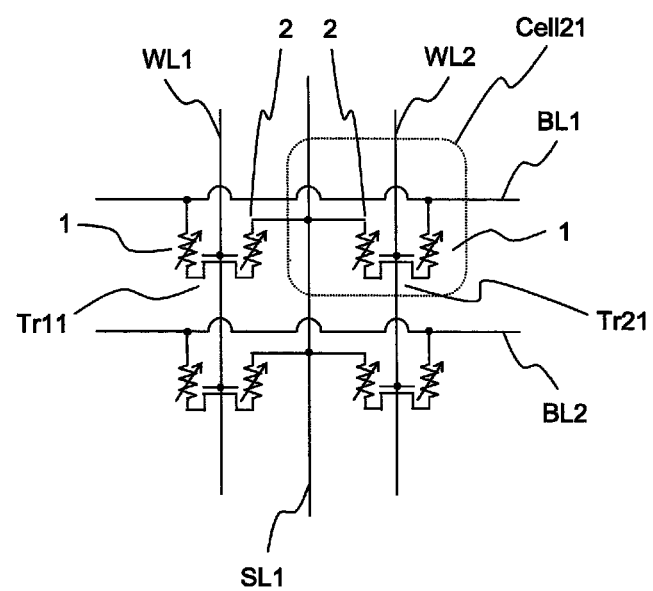

MAGNETIC MEMORY, METHOD OF MANUFACTURING THE SAME, AND METHOD OF DRIVING THE SAME

TECHNICAL FIELD

The present invention relates to a storage device with using an element having magnetoresistive effect caused by spin injection, and, more specifically, the present invention relates to a storage device in which multi-value record is possible.

BACKGROUND ART

In recent years, expectation for a magnetoresistive random access memory (MRAM) as a memory having non-volatile characteristics and achieving high speed, high integration, low power consumption, and high reliability has been increased. A basic element of the MRAM has a structure called magnetic tunnel junction (MTJ) in which an insulating film used for tunnel barrier is interposed between two ferromagnetic layers. The information is recorded by using tunnel magneto-resistance (TMR) effect that a resistance of the element is significantly different depending on either a parallel direction or a non-parallel direction in magnetization of these two ferromagnetic layers. More particularly, by a (spin-injection magnetization reversal type) method of rewriting the magnetization direction by bi-directionally carrying a current in the TMR element so as to inject spin-polarized electrons which are different depending on the magnetization of the ferromagnetic layers, a writing current can be reduced in accordance with microfabrication, so that the high integration and the low power consumption are possible in accordance with scaling of a semiconductor device. Also in such a memory, a multi-value technique capable of storing a lot of information in one memory cell has been studied for achieving a low bit cost.

Here, Patent Document 1 describes a magnetic memory in which the multi-value technique is achieved by connecting a plurality of TMR elements in series to each other. Also, Patent Document 2 and Patent Document 3 describe a magnetic memory in which a storage element of a memory cell is formed by arranging a plurality of TMR elements in parallel to each other with using a spin-injection magnetization reversal element.

PRIOR ART DOCUMENTS

Patent Documents

Patent Document 1: Japanese Patent Application Laid-Open Publication No. 2003-78114
Patent Document 2: Japanese Patent Application Laid-Open Publication No. 2007-281334
Patent Document 3: Japanese Patent Application Laid-Open Publication No. 2008-243933

DISCLOSURE OF THE INVENTION

Problems to be Solved by the Invention

However, the structures described in the prior art documents have the following problems.

First, the memory cell described in the Patent Document 1 is formed of TMR elements each type of which rewrites the information with using magnetic field, and which require a wiring for generating the writing magnetic field for each of the plurality of TMR elements connected in series, and therefore, an operation for driving each wiring is complicated in addition to increase in manufacturing steps. Also, there is a disadvantage of increase in the magnetic field required for the rewriting in accordance with the microfabrication of the element.

Further, in the memory cell described in each of the Patent Document 2 and the Patent Document 3, for example, when two TMR elements are represented by variable resistances ($r_1$ and $r_2$) (in FIG. 1A), storage information for two bits is stored as a combination of four resistance values ($R_1$, $R_2$, $R_3$, and $R_4$) determined by the r1 and the r2 as illustrated in FIG. 1B. This is because a high value and a low value can be taken for the respective $r_1$ and $r_2$ so that the four resistance values can be achieved by the combination of these high and low values. For example, it is assumed that combinations of a low value/low value, a low value/high value, a high value/low value, and a high value/high value as the combination of the $r_1$ and the $r_2$ correspond to the $R_1$, the $R_2$, the $R_3$, and the $R_4$, respectively. In a state of, for example, the $R_1$ in such an element, when a current ($I^+_A$) is carried in the parallel-state elements so that the resistance of the element $r_1$ is high to write the information in a state of the $R_3$, a state of the resistance of the element $r_2$ should not be changed by that current. However, since both of the elements are practically connected in parallel, a current flowing in the element $r_1$ is adversely changed in accordance with a resistance ratio. As also seen in a case of other writing information, a required current is increased by the number of the parallel connections.

In the Patent Document 2, FIG. 1A is configured by arranging a plurality of free layers, whose thicknesses are different from each other, on a ferromagnetic fixed layer whose magnetization direction is fixed and a tunnel insulating film which is a non-magnetic separating layer. Although the resistance of each element is changed depending on difference of the thickness, the above-described problems are not essentially solved. Also, as the manufacturing method, it is required to repeat a plurality of times of the formation and process of the free layer, and therefore, there are problems such as damage due to the process, difficulty in the formation of a fine shape, and the complicated manufacturing.

In the Patent Document 3, FIG. 1A is configured by providing a plurality of magnetization reversal elements, whose shapes are different from each other, in the same plane. However, in the magnetization reversal elements, easiness of change of the magnetization direction is generally featured by using plane-shape anisotropy, and therefore, the shape cannot be freely set. Further, in a case of elements whose film structures are the same, a resistance of each element is inversely proportional to an area size of the element, and therefore, a current density flowing in each element is constant. Therefore, when a threshold current density for the rewriting is the same among the parallel-connected elements, there is a problem that the information is simultaneously changed. Note that, even by the present structure, the above-described problems are not essentially solved.

In a multi-valued magnetic memory with using a spin-injection magnetization reversal type element, it is required to solve various problems in consideration of the complicated memory operation and the high integration/low cost as described above.

Means for Solving the Problems

The above-described problems are solved by providing two or more magnetoresistive effect elements which are electrically connected in series and selecting one of the series-connected elements for performing the writing depending on a direction, a magnitude, and an order of each current carried in the series-connected elements. For example, by differentiating a plane area size of each of the magnetoresistive effect elements from the other whose film structures are the same, a resistance change amount caused by each magnetization reversal and a threshold current value required for the magnetization reversal are differentiated from the other, so that the above-described problems are solved.

Effects of the Invention

The present invention can achieve a magnetic memory whose manufacturing is easy, whose information rewriting is simple, and in which multi-value recording and reading are possible.

BRIEF DESCRIPTIONS OF THE DRAWINGS

FIG. 4 is a diagram explaining a writing sequence of the magnetic memory of the present invention;

FIG. 11 is a circuit diagram of a principal part based on a cell structure of FIG. 10.

BEST MODE FOR CARRYING OUT THE INVENTION

First Embodiment

Figure 1A:
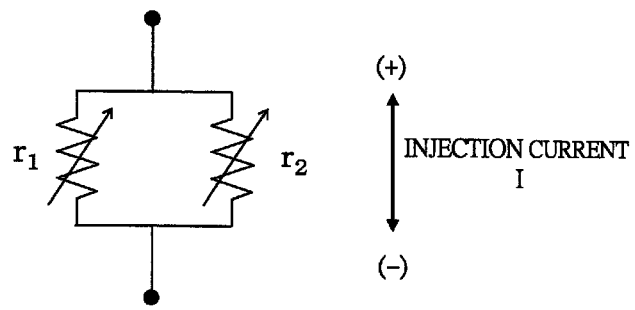
FIG. 1A is a diagram explaining a structure of a magnetic memory described in a prior art document.
Figure 1B:
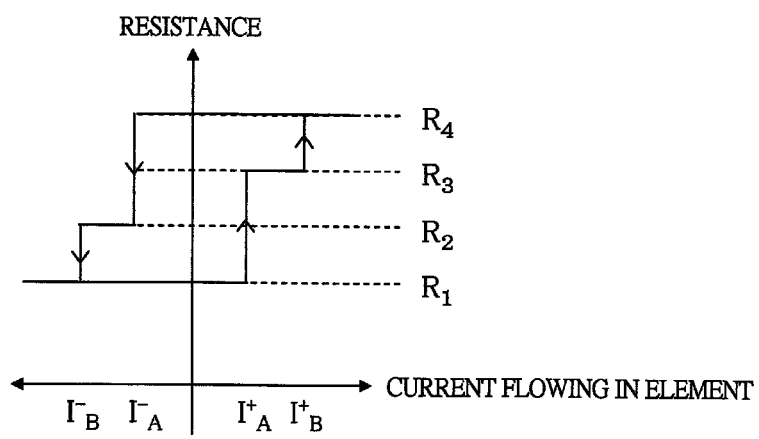
FIG. 1B is a diagram explaining a multi-value operation of a magnetic memory described in another prior art document.
Figure 2A:
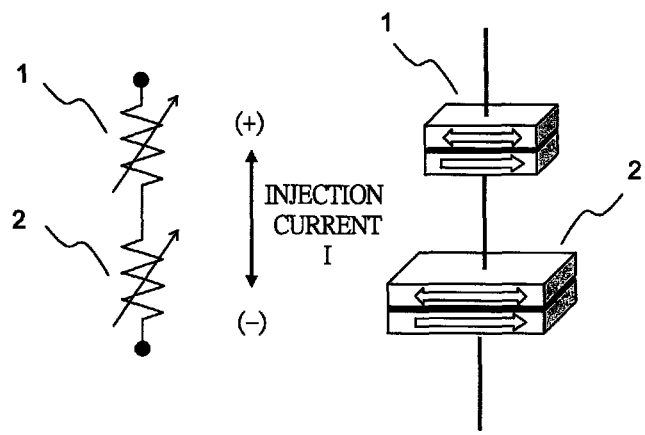
FIG. 2A is a diagram explaining a basic structure of a magnetic memory of the present invention.
Figure 2B:
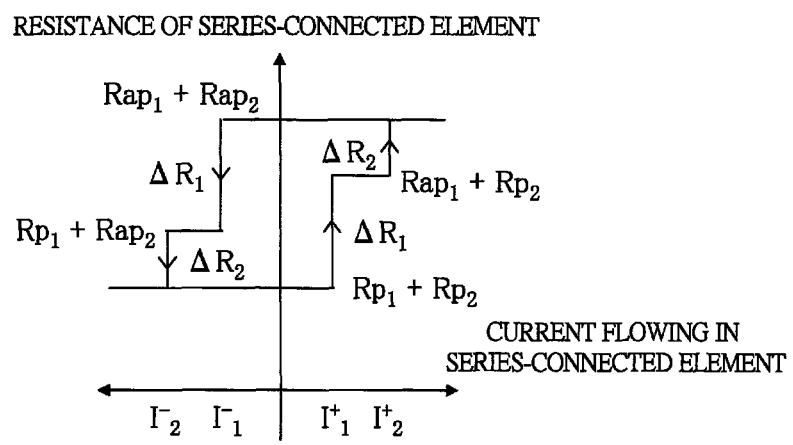
FIG. 2B is a diagram explaining an operation of the magnetic memory of the present invention.
Figure 3A:
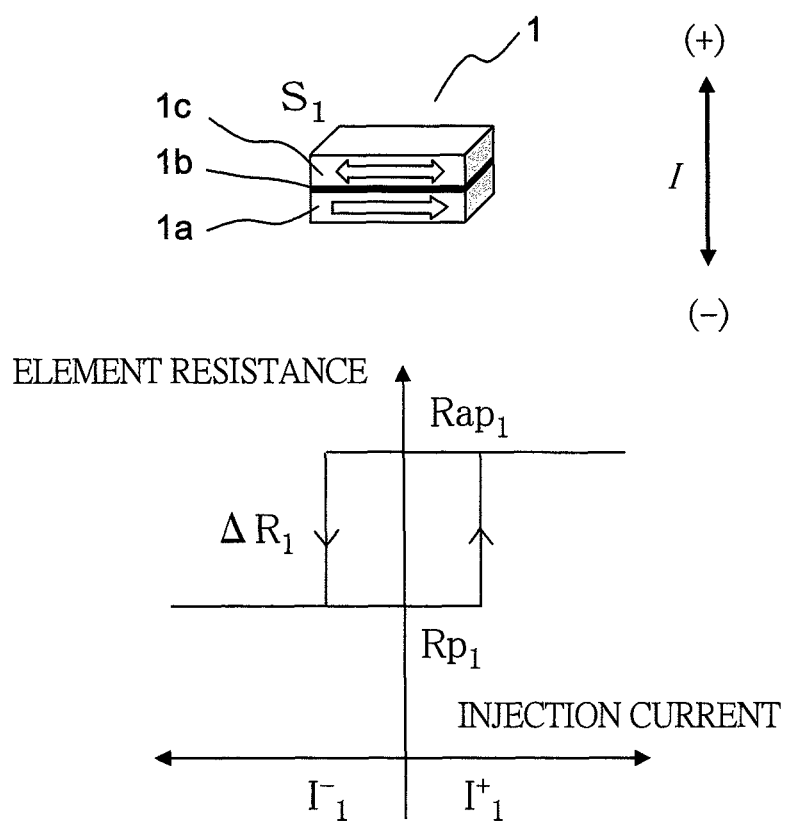
FIG. 3A is a diagram illustrating an example of a magnetoresistive effect element used for the magnetic memory of the present invention.
Figure 3B:
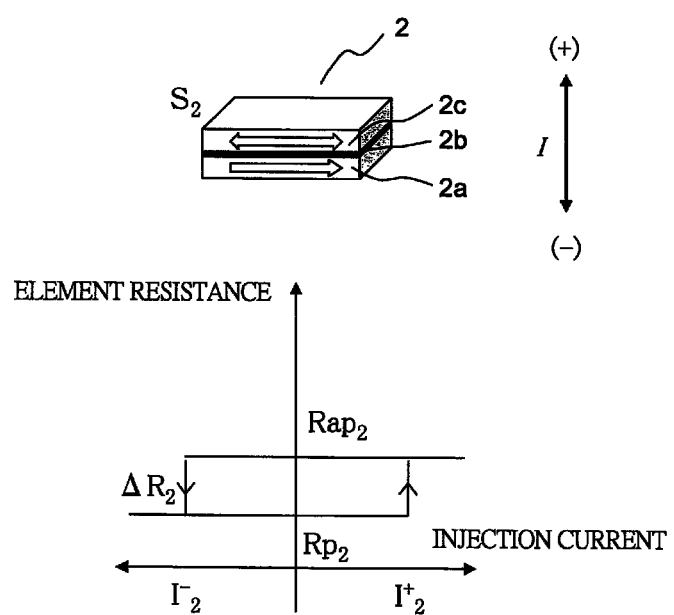
FIG. 3B is a diagram illustrating another example of the magnetoresistive effect element used for the magnetic memory of the present invention.

FIG. 2A illustrates a basic structure of a magnetic memory of the present invention, and FIG. 2B illustrates current-resistance characteristics thereof. The magnetoresistive effect elements 1 and 2 are electrically connected in series to each other. Therefore, as described below, the characteristics can be obtained from current-resistance characteristics of the elements 1 and 2 which are independent to each other (in FIGS. 3A and 3B).

The respective magnetoresistive effect elements 1 and 2 include: ferromagnetic fixed layers 1a and 2a each of whose magnetization is fixed; non-magnetic tunnel insulating films 1b and 2b; and free layers 1c and 2c each of whose magnetization is variable. Here, in the elements 1 and 2, when each layer is made of the same material and has the same film structure, and besides, is simultaneously formed with the other if required, uniform thickness and characteristics can be secured. Further, when their plane shapes vertical to a current direction are the same such that their aspect ratios are the same, even if plane area sizes $S_1$ and $S_2$ of both of them are different from each other, effects of the shape anisotropy of both of them can be the same. In this manner, in the elements 1 and 2, a resistance ratio (TMR ratio) between a resistance Rp in a parallel magnetization state and a resistance Rap in a non-parallel magnetization state and the threshold current density required for the rewriting are constant. Therefore, threshold current values $I^+_1$ and $I^+_2$ obtained when a current is carried in a positive (+) direction of the elements 1 and 2 and threshold current values $I^-_1$ and $I^-_2$ obtained in a negative (−) direction, by which the respective resistances are changed, are expressed as the following relationship described below depending on the element area sizes.

$$Rap_1/Rp_1 = Rap_2/Rp_2$$

$$I^+_2 = I^+_1 \times S_2/S_1$$

$$I^-_2 = \times S_2/S_1$$

Also, the respective element resistances are inversely proportional to the area sizes, and therefore, the following relationship can be expressed.

$$Rp_2 = Rp_1 \times S_1/S_2$$

Therefore, by selecting different values from each other for the element area sizes $S_1$ and $S_2$, different values from each other can be simply set for the threshold current values $I^{+-}_1$ and $I^{+-}_2$ of the respective elements and the resistance change amounts $\Delta R_1$ (=$Rap_1-Rp_1$) and $\Delta R_2$ (=$Rap_2-Rp_2$) thereof. Note that, in the element characteristics illustrated in the drawing, a horizontal-axis negative direction is a direction in which electrons are flown from the fixed layer to the free layer, and therefore, the electrons spin-polarized by the fixed layer are injected into the free layer, so that a parallel state of the magnetization is caused. Conversely, a horizontal-axis positive direction is a direction in which a non-parallel state of the magnetization is caused, and is a direction in which the element resistances are increased.

In the case that these elements as illustrated in FIG. 2B are connected in series, the resistance-current relationship is expressed as that, first, when the magnetization of the free layers of both of the magnetoresistive effect elements is in the parallel state, the resistance value is "$Rp_1+Rp_2$", and that, when the electrons are carried in the direction from the free layer to the fixed layer (the horizontal-axis positive direction in FIG. 2B), the magnetization of the magnetoresistive effect element 1 whose area size is small ($S_1$) and whose threshold current ($I^+_1$) is low is firstly changed to be the non-parallel state, so that the resistance value is changed to be "$Rap_1+Rp_2$" (the resistance change amount+$\Delta R_1$). When the current is further increased so as to reach the threshold current value $I^+_2$ of the magnetoresistive effect element 2, the magnetization of the magnetoresistive effect element 2 is also changed to be the non-parallel state, so that the resistance value is changed to be "$Rap_1+Rap_2$" (the resistance change amount+$\Delta R_2$). Further, when the current is carried in the reverse direction (the horizontal-axis negative direction in FIG. 2B) under the non-parallel state in both of them, the magnetization of the magnetoresistive effect element 1 is changed to be the parallel state at the current value $I^-_1$, so that the resistance value is "$Rp_1+Rap_2$" (the resistance change amount $-\Delta R_1$). When the current in the reverse direction is further increased so as to reach the $I^-_2$, the magnetization of the magnetoresistive effect element 2 is also changed to be the parallel state, so that the resistance value is returned to "$Rp_1+Rp_2$" (the resistance change amount $-\Delta R_2$).

As described above, in order to structure the characteristics illustrated in FIG. 2B with the connection between the two magnetoresistive effect elements, the two magnetoresistive effect elements should not be rewritten at the same time by the current injected into the elements. That is, it is required to differentiate the threshold current of each of the magnetoresistive effect elements from the other ($I^{+-}_1 \neq I^{+-}_2$). In addition, in order to determine the storage information for the reading from the whole resistance of the connected elements, it is required to differentiate the resistance change amounts ($\Delta R_1 \neq \Delta R_2$) caused by the rewriting of each element from the other so as to clarify which element has been rewritten.

By using such characteristics, the information for two bits can be stored in one memory cell which is formed of two elements, so that the writing and reading operations can be performed as described below. An example of a writing sequence in the present memory cell is illustrated in FIG. 4. It is assumed that "0" is set for information in the parallel state in either one of the elements, "1" is set for information in the non-parallel state in either one of the elements, "00" is set for the case of the parallel state in both of the series-connected elements, "10" and "01" are set for the case of the non-parallel state in either one of the elements 1 and 2, and "11" is set for the case of the non-parallel state in both of the elements. Generally, the state obtained right after the manufacturing is "00" since magnetic states of all elements are equalized to be the parallel state in an anneal step in a magnetic field. However, the state of each element is inconstant through the rewriting operation or thermal fluctuation. Also in this case, regardless of a previous state, the information in the "00" and the "11" can be rewritten by injecting the respective currents $I^-_2$ and $I^+_2$. On the other hand, in the case of the "01", it is required to perform a sequence having two stages, in which the current of $I^+_2$ is injected first so as to write the "11", and then, the current of $I^-_1$ in the reverse direction is injected. The reading operation can be achieved by reading the resistance value with using a current equal to or lower than the rewriting current. In this manner, by connecting two magnetoresistive effect elements in series whose element structures are the same as each other but whose area sizes are different from each other, the resistance change amount between the elements and the rewriting threshold current value are differentiated from each other, so that a four-valued memory element having a relationship between the resistance values of the series-connected elements expressed as "$(Rp_1+Rp_2)<(Rp_1+Rap_2)<(Rap_1+Rp_2)<(Rap_1+Rap_2)$" can be simply achieved.

Figure 5A:
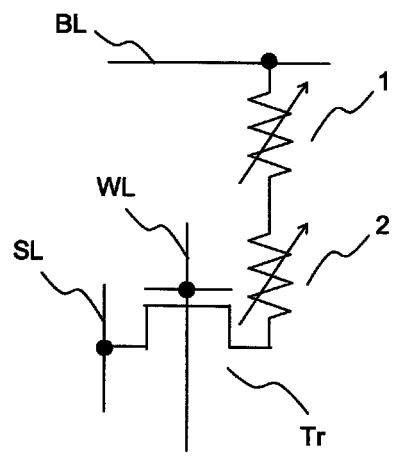
FIG. 5A is a basic structure diagram of a magnetic memory cell of the present invention.
Figure 5B:
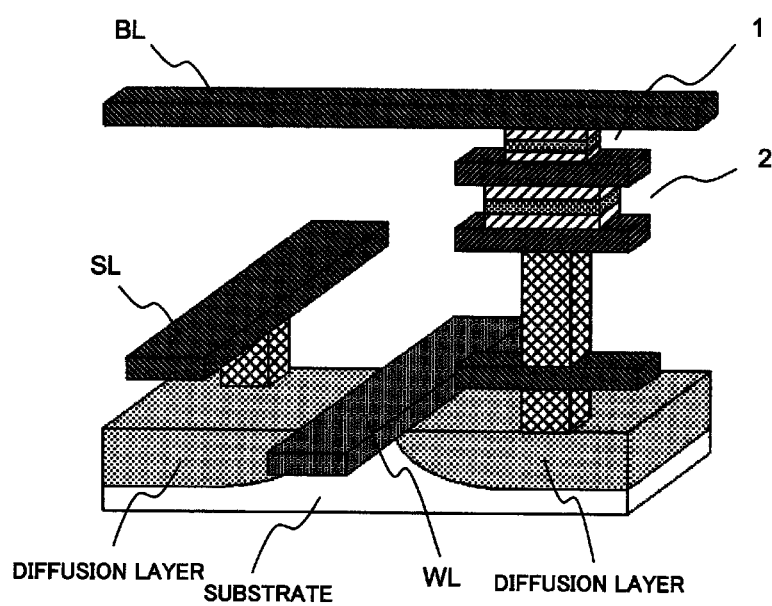
FIG. 5B is an overhead view of the magnetic memory cell of the present invention.

FIGS. 5A and 5B illustrate a basic memory cell structure of a magnetic memory of the present invention. One of the series-connected magnetoresistive effect elements 1 and 2 is connected to a bit line BL, and the other is connected to a source line SL via a transistor Tr which is a selective element of the memory cell. The memory cell is selected by applying a bias voltage to the bit line EL or the source line SL and a word line WL which is a gate electrode of the transistor Tr, so that the current is injected to the series-connected magnetoresistive effect elements.

The example of the four-valued memory with using the two magnetoresistive effect elements has been described above. However, a $2^N$-valued memory element can be similarly achieved with using "N" (three or more) magnetoresistive effect elements. Also in this case, it is required to differentiate each resistance change amount and each threshold current value from the other.

Generally, the magnetoresistive effect element is formed of: the fixed layer whose magnetization is fixed in one direction; the tunnel insulating layer; and the free layer whose magnetization direction can be switched by the spin-injection magnetization reversal. While aluminum oxide, magnesium oxide, or others is used as a material of the tunnel barrier layer, magnesium oxide which causes the larger resistance change is desired. For the ferromagnetic layer to be the fixed layer and the free layer, as a material thereof whose magnetization is in an in-plane direction, Co, Fe, Ni, an alloy made of them, or a stacked layer made of the alloy is used. More particularly, in the case of using the magnesium oxide for the tunnel barrier layer, when CoFeB obtained by adding about 20% of B to a CoFe alloy is used, the large resistance change can be obtained. In order to obtain the larger resistance change, it is desired to use a half metal material whose electron spin polarizability is large, such as Heusler alloy. In the magnetoresistive effect element whose magnetization is in the in-plane direction, a magnetization easy axis at which the magnetization is stable is a long-axis direction of the free layer of the tunnel magnetoresistive effect element, and therefore, it is desired to set a ratio "L/W" between a long-axis length "L" of the free layer and a short-axis length "W" thereof to be about 1.5 to 3.

Also, as the ferromagnetic layer to be the fixed layer and the free layer, a perpendicular magnetization film whose magnetization is in a perpendicular direction with respect to a plane thereof can be also used. More specifically, an L10 ordered alloy film such as CoPt, FePt, CoPd, or FePd, a film to which a non-magnetic metal such as Cu, Sn, Pb, Sb, or Bi is added, a film obtained by alternately stacking Co or Fe and Pt or Pd, a film obtained by using Co as a basis element and adding Cr and Pt thereto, or others can be used. The perpendicular magnetization film has large magnetic anisotropy energy inherent to crystal, and therefore, even if the area size of the tunnel magnetoresistive effect element is very small, a thermostability index for maintaining the non-volatile characteristics can be secured. In order to maintain the sufficient non-volatile characteristics for a 45-nm or later generation line width, it is desired that the uniaxial magnetic anisotropy energy of a group of the perpendicular magnetization materials is $5 \times 10^6$ erg/cm$^3$ or higher. Also, in the case of using the perpendicular magnetization film, it is not required to secure the magnetic anisotropy in the shape of the tunnel magnetoresistive effect element, and therefore, the tunnel magnetoresistive effect element can be shaped in circle, so that further microfabrication in the size can be achieved.

Second Embodiment

Figure 6A:
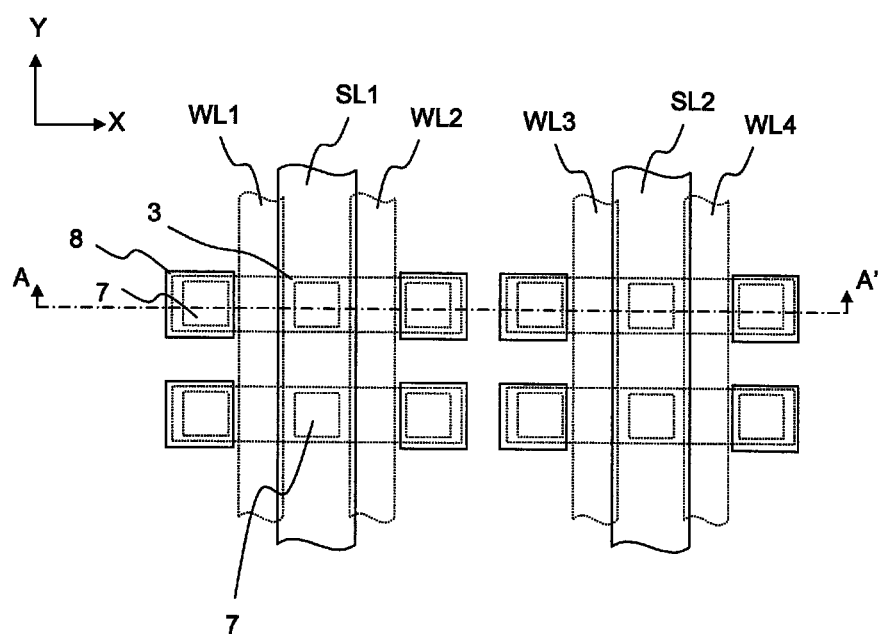
FIG. 6A is a plan view of a principal part illustrating an array structure of a magnetic memory according to one embodiment of the present invention.
Figure 6B:
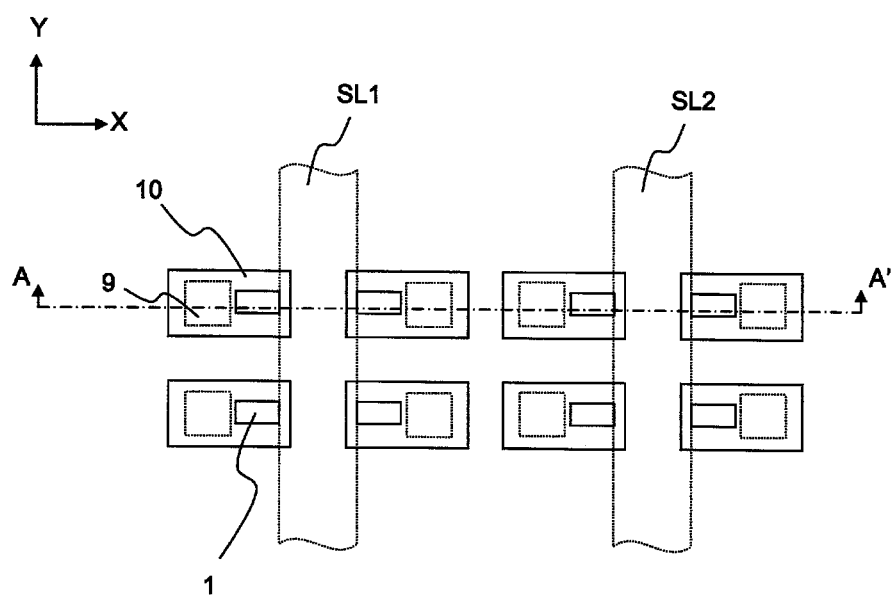
FIG. 6B is another plan view of the principal part illustrating the array structure of the magnetic memory according to one embodiment of the present invention.
Figure 6C:
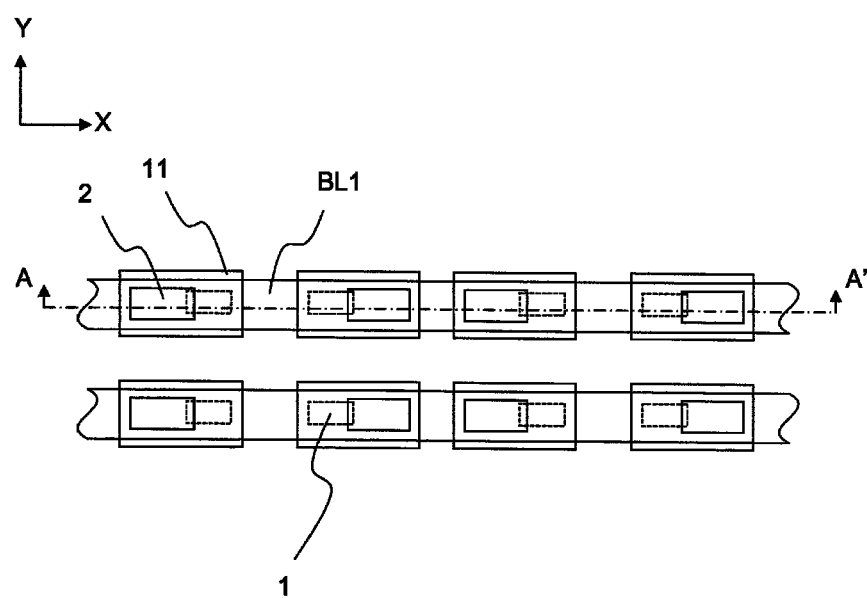
FIG. 6C is still another plan view of the principal part illustrating the array structure of the magnetic memory according to one embodiment of the present invention.
Figure 7:
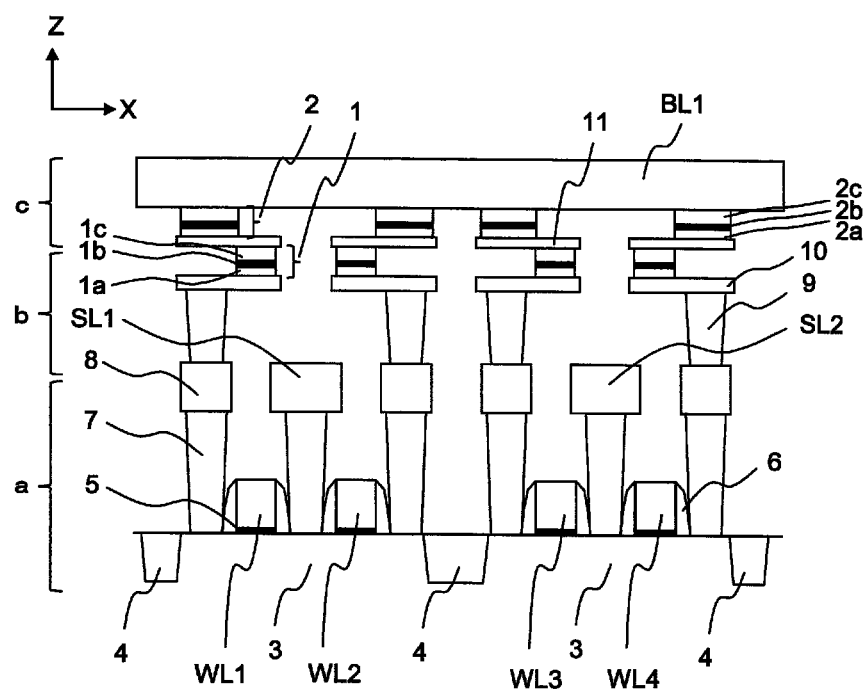
FIG. 7 is a cross-sectional view of a principal part of the magnetic memory along line A-A' of FIGS. 6A to 6C.

A practical memory cell is formed by connecting a transistor to the above-described magnetoresistive effect element so that the current is carried in the magnetoresistive effect element inside the selected memory cell. Each of FIGS. 6A to 7 illustrates a part of a memory array formed of such a memory cell. Each of FIGS. 6A to 6C is a plan view of a principal part of a structure of the memory array. FIG. 7 is a cross-sectional view of a principal part along each line A-A' of FIGS. 6A to 6C, and FIG. 8 is an electric circuit diagram of a corresponding principal part. Note that FIGS. 6A to 6C are plan views obtained by separating the respective layers so as to be easily understood, and mainly correspond to portions of "a" to "c" of FIG. 7, respectively. In order to easily see FIGS. 6A to 7, a part of members such as an insulating film is omitted.

The magnetic memory of the present embodiment is formed of a memory cell including: a MOSFET (transistor) formed on the active region 3 of the semiconductor substrate; and a plurality of magnetoresistive effect elements which are stacked and whose area sizes are different from each other. The transistor forming the memory cell includes a gate insulating film 5 and a gate electrode, and the gate electrode extends in a Y direction of FIG. 6A so as to be shared among a plurality of memory cells to form a word line WL. A source of the transistor is shared with a memory cell adjacent thereto in an X direction thereof in order to reduce the area size of the memory cell, and is connected to a source line SL via a contact hole 7. The source line SL extends in the Y direction so as to be shared among a plurality of memory cells as illustrated in FIGS. 6A and 6B. A drain of the transistor is connected to a lower electrode 10 via the contact hole 7, a wiring 8, and an interlayer plug 9. A first magnetoresistive effect element 1 is arranged on the lower electrode 10, and an upper end thereof is connected to a second lower electrode 11. Similarly, a second magnetoresistive effect element 2 is arranged on the second lower electrode 11, and an upper end thereof is connected to a bit line BL. The bit line BL extends in the X direction so as to be shared among a plurality of memory cells. The above-described respective magnetoresistive effect elements 1 and 2 include: ferromagnetic layers $1a$ and $2a$; and non-magnetic layers $1b$ and $2b$; and ferromagnetic layers $1c$ and $2c$. Here, it is desired that the magnetoresistive effect elements 1 and 2 are the same as each other in a film structure and different from each other in an element area size. At this time, the film formation and the manufacturing are facilitated, and therefore, the rewriting threshold current and the element resistance can be determined so as to depend on the element area size with securing the reliability. Also, FIGS. 6A to 8 illustrate an example that, in two magnetoresistive effect elements, an area size of the second magnetoresistive effect element 2 is larger than that of the first magnetoresistive effect element 1. However, three or more magnetoresistive effect elements may be stacked regardless of the order as long as their area sizes are different from each other.

Figure 8:
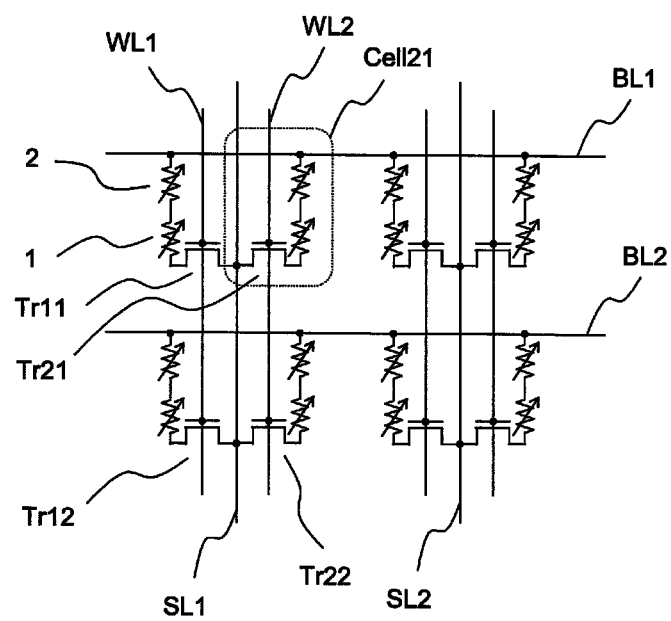
FIG. 8 is a circuit diagram of a principal part of the magnetic memory according to one embodiment of the present invention.

FIG. 8 is a diagram explaining an operation of the above-described memory cell, and illustrates only eight memory cells for simplification. The magnetoresistive effect elements are illustrated as variable resistances whose resistances are changed depending on either the parallel state or non-parallel state of the magnetization of their two ferromagnetic layers. In the case of the reading operation, for example, by applying 1 V to a "WL2" and 0.2 V to a "BL1", a memory cell "Cell21" is selected, and a series resistance between the series-connected magnetoresistive effect elements 1 and 2 is determined. At this time, by applying 0 V to other WL, BL, and SL, other memory cell is not selected. On the other hand, in the case of the writing operation, for example, by applying 1 V to a "WL2", 1 V to a "EL1", 0 V to a "SL1", and 0 V to other WL, BL, and SL, or by applying 1 V to the WL2, 0 V to the EU, 1 V to the SL1, 0 V to other WL, and SL, and 1 V to other BL, the memory cell Cell21 is selected, and the current is bi-directionally carried in the series-connected magnetoresistive effect elements 1 and 2, so that the magnetization direction is changed.

Third Embodiment

In the second embodiment, in order to from each of the two magnetoresistive effect elements, it is required to repeatedly perform the film formation, lithography, processing, the formation of the protective insulating film, and the flattening for each of upper and lower elements. Therefore, the number of the manufacturing steps is large, and a problem of variation in the element characteristics may arise unless each step can be sufficiently uniformly repeated.

In the present embodiment, the two upper and lower element films are formed at once, and only the upper element is processed by the lithography process once. The lower element is processed with using the protective film formed for the upper element and a periphery thereof as a pattern so as to be formed to have an area size obtained by proportionally scaling the shape of the upper element without performing a lithography process.

Figure 9A:
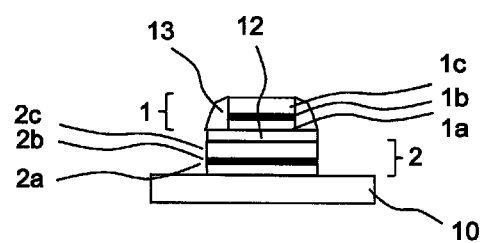
FIG. 9A is a modification example diagram of a magnetoresistive effect element illustrated in FIGS. 6A to 8.

FIG. 9A is a cross-sectional view of a principal part of the magnetoresistive effect element according to the third embodiment of the present invention. The lower-layer magnetoresistive effect element 2 is formed with using the upper-layer magnetoresistive effect element 1 and a sidewall 13 as a mask, so that the manufacturing steps are simplified, and besides, the shapes of the two magnetoresistive effect elements are proportionally scaled to each other, and therefore, the high-accurate characteristics can be set. The transistor, the wiring, the electric circuit diagram, and the memory cell operation are the same as those of the second embodiment. Similarly to the second embodiment, in the magnetic memory of the present embodiment, the magnetoresistive effect element 2, the conductive layer 12 which is the intermediate portion, and the magnetoresistive effect element 1 are stacked on the lower electrode 10 formed from the drain of the transistor via the contact hole 7, the wiring 8, and the interlayer plug 9, and the upper end of the magnetoresistive effect element 1 is connected to the bit line BL. The above-described respective magnetoresistive effect elements 1 and 2 include the ferromagnetic layers $1a$ and $2a$, the non-magnetic layers $1b$ and $2b$, and the ferromagnetic layers $1c$ and $2c$, and the lower-layer magnetoresistive effect element 2 is formed by using the sidewall 13 of the magnetoresistive effect element 1 so as to have the shape which is proportionally scaled to that of the upper-layer magnetoresistive effect element 1 and whose area size is larger than that of the same. Here, FIG. 9A illustrates the example that the two magnetoresistive effect elements are stacked. However, three or more magnetoresistive effect elements may be stacked as long as their area sizes are different from each other. Also, similarly to the second embodiment, it is desired that the magnetoresistive effect elements 1 and 2 have the same film structure. At this time, the rewriting threshold current and the element resistance can be determined depending on the highly-accurately controlled element area size with securing the reliability.

Next, an example of a method of manufacturing the magnetic memory formed as described above will be explained. Similarly to the above-described second embodiment, after the transistor, the wiring layer, and the lower electrode 10 are formed, the magnetoresistive effect element 1, the conductive layer 12 which is the intermediate portion, and the magnetoresistive effect element 2 are formed on the lower electrode 10. For example, by forming them in a vacuum integration process with using a sputter method, a high-quality and uniform film can be formed without being damaged from an impurity, a process, or others.

Figure 9B:
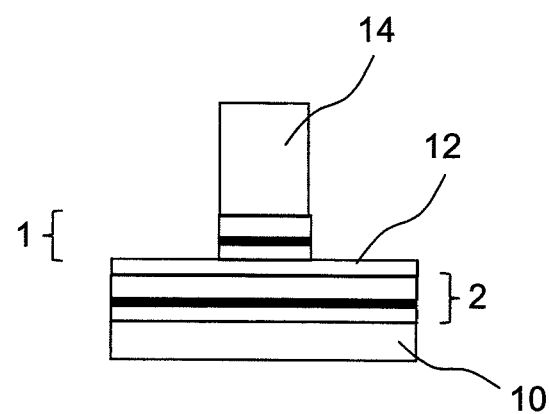
FIG. 9B is the modification example diagram of the magnetoresistive effect element illustrated in FIGS. 6A to 8.
Figure 9C:
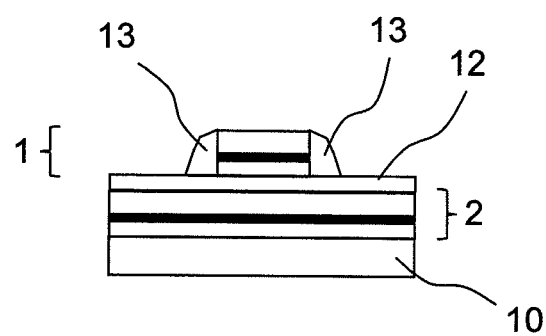
FIG. 9C is the modification example diagram of the magnetoresistive effect element illustrated in FIGS. 6A to 8.

Subsequently, the above-described magnetoresistive effect element 1 is patterned by a lithography technique (with using a photoresist 14) and an ion beam etching technique or a plasma etching technique (see FIG. 9B). Next, for example, a silicon oxide film, a silicon nitride film, or others is deposited and etched-back by a sputter method or a CVD (Chemical Vapor Deposition) method, so that the sidewall 13 is formed in periphery of the magnetoresistive effect element 1 (see FIG. 9C). Further, the conductive layer 12 which is the intermediate portion and the magnetoresistive effect element 2 are patterned with using the magnetoresistive effect element 1 and the sidewall 13 as a mask, so that the magnetoresistive effect elements stacked as illustrated in FIG. 9A are formed. As described above, a relative position between the magnetoresistive effect element 1 and the magnetoresistive effect element 2 and a ratio of the area sizes thereof can be highly-accurately controlled, and the lithography process for patterning the magnetoresistive effect element 2 or others can be eliminated.

Fourth Embodiment

In the second and third embodiments, the plurality of magnetoresistive effect elements are provided in series at one end of the transistor. However, in this structure, when the current is carried in the direction from the transistor to the magnetoresistive effect elements, a source follower state is caused, in which the resistance of the magnetoresistive effect elements is a source resistance to decrease an effective gate voltage, which results in decrease in a driving performance of the transistor.

Figure 10:
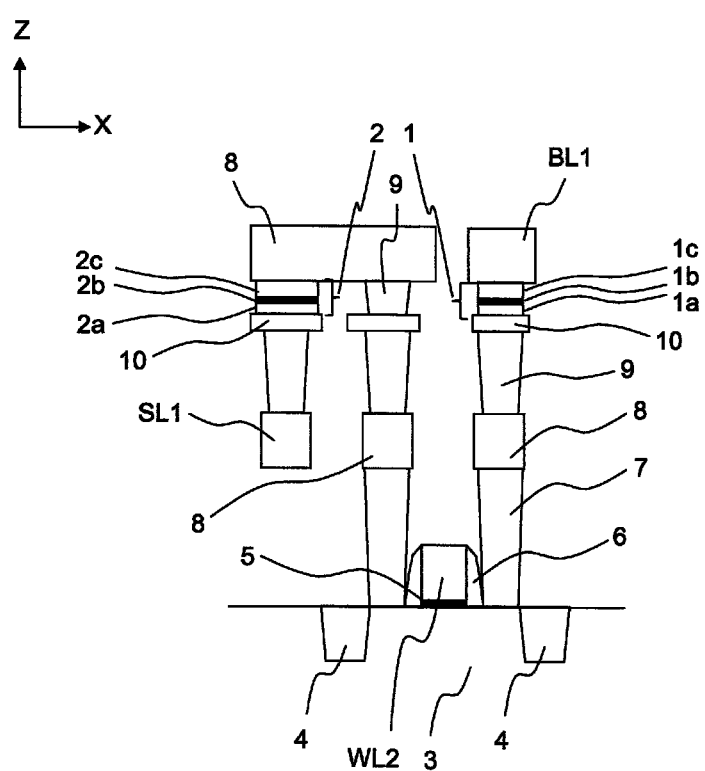
FIG. 10 is a cross-sectional view of a principal part of a magnetic memory according to another embodiment of the present invention.

FIGS. 10 and 11 illustrate another embodiment for solving such a problem. They illustrate a cross-sectional view of a principal part of the memory cell and an electric circuit diagram of a principal part of a memory array thereof, respectively. In the magnetic memory of the present embodiment, the magnetoresistive effect element 1 is formed on the lower electrode 10 via the contact hole 7, the wiring 8, and the interlayer plug 9 from one end of the transistor, and an upper end of the magnetoresistive effect element 1 is connected to the bit line BL1. The other end of the transistor is connected to an upper end of the magnetoresistive effect element 2 via the contact hole 7, the wiring 8, and the interlayer plug 9. The magnetoresistive effect element 2 is formed on the lower electrode 10, and is connected to a source line SL1 via the interlayer plug 9. This structure is different from those of the above-described second and third embodiments in that the magnetoresistive effect elements are provided on both ends of the transistor. By this structure, the source resistance in the source follower state can be reduced, and therefore, a bidirectional current in the transistor can be secured. Further, as illustrated in FIG. 10, it is desired that the magnetoresistive effect elements 1 and 2 include the ferromagnetic layers 1a and 2a, the non-magnetic layers 1b and 2b, and the ferromagnetic layers 1c and 2c on the same layer so that the elements have the same film structure as each other but that the element area sizes are different from each other. Here, the ferromagnetic layer 1a in the magnetoresistive effect element 1 and the ferromagnetic layer 2c in the magnetoresistive effect element 2 are connected on the transistor side. By this structure, the magnetoresistive effect elements 1 and 2 can be formed with performing the formation of the magnetoresistive effect elements once and the lithography process once on the same layer, and therefore, the manufacturing step can be simplified.

The transistor, the wiring, the electric circuit diagram, and the memory cell operation are the same as those of the second embodiment, and the contents described in the second embodiment are applicable to the present embodiment unless the circumstance are exceptional.

The above-described first to fourth embodiments describe the example of achieving the multi-value technique with using the two or more magnetoresistive effect elements whose area sizes are different from each other. However, an integration degree of the memory cell is determined by a larger area size of either of the magnetoresistive effect elements or an area size of the transistor in some cases. In a case that the current value required for the rewriting of the magnetoresistive effect element is high, and besides, that the area size of the transistor is sufficiently larger, there is no problem even in the structure. However, in a case that the area size of the transistor is sufficiently smaller, a following method is desired for high integration. As illustrated in FIGS. 2A and 2B, a required condition for the multi-value technique is only that the resistance change amounts $\Delta R_1$ and $\Delta R_2$ of the respective elements, the threshold current values $I^+_1$ and $I^+_2$ and $I^-_1$ and $I^-_2$ thereof are different from each other. Therefore, even in the same element area size, the multi-value technique of the present invention can be also achieved by a method such that the element resistance and the TMR ratio are changed by changing the thickness of the element film such as the tunnel insulating film for each magnetoresistive effect element, such that the threshold current is changed by the shape anisotropy effect caused by changing the element shape such as changing an aspect ratio of a rectangular element or using an elliptical element, or such that the perpendicular magnetization film optimized by the material or the film structure for each element is used.

SYMBOL EXPLANATION

1: magnetoresistive effect element, 1a: ferromagnetic layer, 1b: non-magnetic layer, 1c: ferromagnetic layer, 2: magnetoresistive effect element, 2a: ferromagnetic layer, 2b: non-magnetic layer, 2c: ferromagnetic layer, 3: semiconductor substrate active region, 4: element-separation insulating region, 5: gate insulating film, 6: gate sidewall, 7: contact hole, 8: wiring, 9: interlayer plug, 10: lower electrode, 11: lower electrode, 12: conductive layer, 13: sidewall, 14: photoresist, SL: source line, WL: word line, BL: bit line, Tr: transistor, Cell: memory cell

The invention claimed is:

1. A magnetic memory with a magnetoresistive effect element of a spin-injection magnetization reversal type,
wherein the magnetoresistive effect element includes: a first ferromagnetic layer whose magnetization is substantially fixed; a second ferromagnetic layer whose magnetization direction is variable by spin injection; and a non-magnetic layer which is provided between the first ferromagnetic layer and the second ferromagnetic layer,
one memory cell includes a plurality of the magnetoresistive effect elements, threshold current amounts required for magnetization reversal of the plurality of respective magnetoresistive effect elements in the one memory cell are different from each other, and in the one memory cell,
- the first ferromagnetic layers of the plurality of magnetoresistive effect elements are of the same material and thickness,
- the second ferromagnetic layers of the plurality of magnetoresistive effect elements are of the same material and thickness,
- the non-magnetic layers of the plurality of magnetoresistive effect elements are of the same material and thickness,
- in each magnetoresistive effect element, the first ferromagnetic layer, the second ferromagnetic layer, and the non-magnetic layer are all of a same shape and area size, and
- the plurality of magnetoresistive effect elements are of different element area sizes.

2. The magnetic memory according to claim 1, wherein resistance change amounts caused by magnetization reversal of the plurality of magnetoresistive effect elements in the one memory cell are different from each other.

3. The magnetic memory according to claim 1, wherein the plurality of magnetoresistive effect elements in the one memory cell are electrically connected in series to each other.

4. The magnetic memory according to claim 1, wherein element plane shapes of the plurality of magnetoresistive effect elements in the one memory cell are similar shapes to each other.

5. The magnetic memory according to claim 4, wherein the plurality of magnetoresistive effect elements in the one memory cell are stacked so that an element area size of a lower-layer magnetoresistive effect element is larger than an element area size of an upper-layer magnetoresistive effect element.

6. The magnetic memory according to claim 1, wherein the magnetic memory includes a bidirectional-current driving element which is electrically connected to the plurality of magnetoresistive effect elements so as to bi-directionally carry a current.

7. The magnetic memory according to claim 6, wherein one or more magnetoresistive effect elements are electrically connected on each of both sides of the bidirectional-current driving element.

8. The magnetic memory according to claim 1, wherein an area ratio between adjacent magnetoresistive effect elements in the memory cell is constant.

9. The magnetic memory according to claim 1, wherein the threshold current amounts required for magnetization reversal in each respective magnetoresistive effect element are proportional to the area size of the respective magnetoresistive effect element.

10. The magnetic memory according to claim 9, wherein a ratio of the threshold current amounts required for magnetization reversal in adjacent magnetoresistive effect elements is proportional to a ratio of the area sizes of the adjacent magnetoresistive effect elements.

11. The magnetic memory according to claim 1, wherein an area size of one of the magnetoresistive effect elements is about twice that of an area size of an adjacent magnetoresistive effect element in the one memory cell.

12. A method of manufacturing a magnetic memory,
the magnetic memory including a plurality of magnetoresistive effect elements in one memory cell, each of the plurality of magnetoresistive effect elements including: a first ferromagnetic layer whose magnetization is substantially fixed; a second ferromagnetic layer whose magnetization direction is variable by spin injection; and a non-magnetic layer which is provided between the first ferromagnetic layer and the second ferromagnetic layer, and
wherein threshold current amounts required for magnetization reversal of the plurality of respective magnetoresistive effect elements in the one memory cell are different from each other, and the plurality of magnetoresistive effect elements in the one memory cell are stacked so that an element area size of a lower-layer magnetoresistive effect element is larger than an element area size of an upper-layer magnetoresistive effect element and so that plane shapes of each of the plurality of magnetoresistive effect elements are similar shapes to each other,
wherein the method includes:
a first step of integrally forming the plurality of magnetoresistive effect elements;
a second step of patterning an upper-layer magnetoresistive effect element of the plurality of magnetoresistive effect elements;
a third step of forming a sidewall on a side wall of the upper-layer magnetoresistive effect element; and
a fourth step of patterning a lower-layer magnetoresistive effect element using the upper-layer magnetoresistive effect element and the sidewall as a mask, and
the third step and the fourth step are repeated until the lowermost-layer magnetoresistive effect element is patterned.

* * * * *